(12) United States Patent
Brueck et al.

(10) Patent No.: US 9,209,377 B2
(45) Date of Patent: Dec. 8, 2015

(54) THERMOELECTRIC MODULE FOR A THERMOELECTRIC GENERATOR OF A VEHICLE WITH A SEALING ELEMENT AND VEHICLE HAVING THE THERMOELECTRIC MODULE

(71) Applicant: EMITEC GESELLSCHAFT FUER EMISSIONSTECHNOLOGIE MBH, Lohmar (DE)

(72) Inventors: Rolf Brueck, Bergisch Gladbach (DE); Sigrid Limbeck, Much (DE)

(73) Assignee: EMITEC GESELLSCHAFT FUER EMISSIONSTECHNOLOGIE MBH, Lohmar (DE)

( * ) Notice: Subject to any disclaimer, the term of this patent is extended or adjusted under 35 U.S.C. 154(b) by 0 days.

(21) Appl. No.: 13/792,635

(22) Filed: Mar. 11, 2013

(65) Prior Publication Data

US 2013/0199590 A1 Aug. 8, 2013

Related U.S. Application Data

(63) Continuation of application No. PCT/EP2011/064409, filed on Aug. 22, 2011.

(30) Foreign Application Priority Data

Sep. 9, 2010 (DE) .......................... 10 2010 044 803

(51) Int. Cl.
  *H01L 35/32* (2006.01)
  *F01N 5/02* (2006.01)

(52) U.S. Cl.
  CPC ................ *H01L 35/32* (2013.01); *F01N 5/025* (2013.01); *Y02T 10/16* (2013.01)

(58) Field of Classification Search
  CPC .......... H01L 35/32; Y02T 10/16; F01N 5/025

USPC .......................... 136/205, 208–210, 228, 230
See application file for complete search history.

(56) References Cited

U.S. PATENT DOCUMENTS

| 3,054,840 A | 9/1962 | Alsing |
| 3,243,869 A | 4/1966 | Sandberg, Jr. |

(Continued)

FOREIGN PATENT DOCUMENTS

| CN | 1652368 A | 8/2005 |
| DE | 878521 C | 6/1953 |

(Continued)

OTHER PUBLICATIONS

Wo 2009103664 machine translation.*
International Search Report of PCT/EP2011/064409.
International Search Report of PCT/EP2011/064409 Sep. 28, 2011.

*Primary Examiner* — Susan D Leong
(74) *Attorney, Agent, or Firm* — Laurence Greenberg; Werner Stemer; Ralph Locher

(57) ABSTRACT

A thermoelectric module includes an inner circumferential surface and an outer circumferential surface each being assigned to a respective hot side or cold side and forming an intermediate space therebetween, a geometric axis and at least one sealing element. The sealing element at least partially forms the inner circumferential surface or is separated from the hot side or cold side disposed there only by an electric insulation layer. The sealing element seals the intermediate space at least with respect to the cold side and has at least one electric conductor connecting at least one thermoelectric element disposed in the thermoelectric module to at least one other electric conductor disposed outside the thermoelectric module. A vehicle having the thermoelectric module is also provided.

6 Claims, 5 Drawing Sheets

(56) References Cited

U.S. PATENT DOCUMENTS

| | | | |
|---|---|---|---|
| 4,011,104 A * | 3/1977 | Basiulis | 136/205 |
| 4,056,406 A | 11/1977 | Markman et al. | |
| 6,096,966 A | 8/2000 | Nishimoto et al. | |
| 7,687,704 B2 | 3/2010 | Shimoji et al. | |
| 2003/0184941 A1 * | 10/2003 | Maeda et al. | 361/103 |
| 2004/0100194 A1 | 5/2004 | Eden et al. | |
| 2005/0178425 A1 | 8/2005 | Itoh et al. | |
| 2005/0217714 A1 | 10/2005 | Nishijima et al. | |
| 2007/0199587 A1 * | 8/2007 | Takahashi | 136/208 |
| 2009/0133734 A1 * | 5/2009 | Takahashi | 136/230 |
| 2011/0258995 A1 * | 10/2011 | Limbeck et al. | 60/320 |
| 2011/0314798 A1 | 12/2011 | Limbeck et al. | |

FOREIGN PATENT DOCUMENTS

| | | |
|---|---|---|
| DE | 2427074 A1 | 12/1975 |
| DE | 102005015016 A1 | 11/2005 |
| DE | 102006039024 A1 | 2/2008 |
| DE | 102008060968 A1 | 8/2009 |
| DE | 102008058779 A1 | 5/2010 |
| RU | 2191447 C2 | 10/2002 |
| RU | 2196242 C1 | 1/2003 |
| WO | 2009/103664 A2 | 8/2009 |
| WO | 2010094533 A2 | 8/2010 |

* cited by examiner

THERMOELECTRIC MODULE FOR A THERMOELECTRIC GENERATOR OF A VEHICLE WITH A SEALING ELEMENT AND VEHICLE HAVING THE THERMOELECTRIC MODULE

CROSS-REFERENCE TO RELATED APPLICATION

This application is a continuation, under 35 U.S.C. §120, of copending International Application No. PCT/EP2011/064409, filed Aug. 22, 2011, which designated the United States; this application also claims the priority, under 35 U.S.C. §119, of German Patent Application DE 10 2010 044 803.6, filed Sep. 9, 2010; the prior applications are herewith incorporated by reference in their entirety.

BACKGROUND OF THE INVENTION

Field of the Invention

The present invention relates to a thermoelectric module, in particular for use in a thermoelectric generator, which is used in a vehicle, wherein the thermoelectric module has at least one sealing element. The invention also relates to a vehicle having the thermoelectric module.

The exhaust gas from an internal combustion engine of a motor vehicle contains thermal energy which can be converted into electric energy by a thermoelectric generator, for example in order to charge a battery or some other energy storage device and/or to feed the required energy directly to electric loads. In that way, the motor vehicle is operated with improved energy efficiency, and there is more energy available to operate the motor vehicle.

A thermoelectric generator of that kind has at least one thermoelectric module. Thermoelectric modules include, for example, at least two semiconductor elements (p-doped and n-doped), which are provided on the upper side and the lower side thereof (facing the hot side or the cold side) with alternating electrically conducting bridges. The two semiconductor elements form the smallest thermoelectric unit or a thermoelectric element. Thermoelectric materials are of such a type that they can convert thermal energy into electric energy in an effective manner (Seebeck effect) and vice versa (Peltier effect). If a temperature gradient is provided on two sides of the semiconductor elements, a voltage potential is formed between the ends of the semiconductor elements. The charge carriers on the hotter side are excited into the conduction band to an increased extent by the higher temperature. Due to the difference in concentration produced during that process in the conduction band, charge carriers diffuse to the colder side of the semiconductor element, giving rise to the potential difference. In a thermoelectric module, it is preferable if a large number of semiconductor elements are connected electrically in series. In order to ensure that the potential differences generated in the serial semiconductor elements do not cancel each other out, alternate semiconductor elements are always brought into direct electric contact with different majority charge carriers (n-doped and p-doped). The circuit can be closed and thus electric power can be taken off by using a connected load resistor.

In order to ensure that the semiconductor elements are fit for operation on a sustained basis, a diffusion barrier is generally disposed between electrically conducting bridges and the thermoelectric material, preventing diffusion of material contained in the electric bridges into the thermoelectric material and hence preventing a loss of effectiveness or functional failure of the semiconductor material and of the thermoelectric element. The construction of thermoelectric modules and of the semiconductor elements is usually accomplished by assembling the individual components, namely the thermoelectric material, the diffusion barrier, the electrically conducting bridges, the insulation and, if appropriate, additional housing elements, to form a thermoelectric module, over which a hot or cold medium flows. That assembly of numerous individual components also requires precise matching of the individual component tolerances and allowance for the heat transfers from the hot to the cold side and adequate contacting of the electrically conducting bridges to enable a flow of current through the thermoelectric material to be produced.

In order to provide for the configuration of such semiconductor elements in a thermoelectric module, housing walls and/or supporting tubes are generally provided to form an external boundary to the module, with the semiconductor elements being attached thereto. In particular, that leads to high tolerance requirements in production in order to achieve accurately fitting configuration of the semiconductor elements on one hand, with respect to the electrical connections and on the other hand, with respect to the position of the housings. Another problem is that the different thermal loads on the outer and inner housing parts mean that different expansion behaviors of those components have to be compensated without introducing particularly high stresses into the thermoelectric material. Precisely with regard to production of thermoelectric modules, there is a desire to be able to combine the large number of components with one another easily, to simplify mounting and handling and also to produce a light but stable structure in the assembly process. The above-mentioned requirements apply equally to sealing elements intended to seal off the respective ends of a thermoelectric module, in particular a tubular module of that kind, ensuring that the hot medium or the cold medium surrounding the thermoelectric module on one side in each case is permanently separated from the thermoelectric elements disposed in the thermoelectric module. In view of the sealing of the thermoelectric module with respect to gaseous and/or liquid media, as robust a construction as possible is required, particularly in the case of those components, making it possible to avoid excessively high requirements with regard to accuracy of fit or with regard to the assembly of such sealing elements.

SUMMARY OF THE INVENTION

It is accordingly an object of the invention to provide a thermoelectric module for a thermoelectric generator of a vehicle with a sealing element and a vehicle having the thermoelectric module, which overcome the hereinafore-mentioned disadvantages and at least partially solve the highlighted problems of the heretofore-known modules and vehicles of this general type. In particular, the intention is to specify a thermoelectric module which can be sealed with respect to a hot medium and a cold medium and, at the same time, is technically simple to produce and has a reduced number of parts. It should furthermore be durable for the desired use and, moreover, should have a high efficiency in order to produce a maximum of electric energy from the thermal energy of an exhaust gas.

With the foregoing and other objects in view there is provided, in accordance with the invention, a thermoelectric module, comprising an inner circumferential surface and an outer circumferential surface which are respectively assigned to a hot side or a cold side. An intermediate space is disposed between the inner circumferential surface and the outer circumferential surface. The thermoelectric module has a geometric axis and at least one sealing element. The sealing element at least partially forms the inner circumferential surface or is separated from the hot side or cold side disposed there only by an electric insulating layer. Furthermore, the sealing element seals the intermediate space at least with respect to the cold side. Moreover, the sealing element has at least one electric conductor, which connects at least one thermoelectric element disposed in the thermoelectric module to at least one second electric conductor, which is itself disposed outside the thermoelectric module.

The sealing element furthermore preferably at least partially forms the outer circumferential surface of the thermoelectric module or is separated from the hot side or cold side disposed at the outer circumferential surface only by an electric insulating layer. In particular, the sealing element also additionally seals the intermediate space at least with respect to the hot side.

In particular, the thermoelectric module forms a separate structural unit of a thermoelectric generator. As a preferred option in this case, the thermoelectric module has a terminal, with which such a thermoelectric module can be connected electrically, if appropriate, to a multiplicity of further thermoelectric modules. In particular, the electrical connection or interconnection of all of the thermoelectric elements integrated into the thermoelectric module is therefore implemented within the module. Such a thermoelectric module is then exposed to a hot medium on a hot side, on one hand, and to a cold medium on a cold side. The focus in this case is particularly on bringing the thermoelectric module into contact with a cold medium by way of its outer circumferential surface and with a hot medium (in particular exhaust gas) by way of its inner circumferential surface or on there being a flow of the media through or around the module. In practice, therefore, the inner circumferential surface forms a "hot side" and the outer circumferential surface forms a "cold side" of the thermoelectric module.

It is furthermore preferred if the thermoelectric module is of elongate construction, that is to say, for example, in the manner of a rail or of a tube. Even if it is very particularly preferred that the thermoelectric module should be configured approximately in the manner of a cylinder or a tube, such a shape is not compulsory. In particular, oval cross sections or polygonal cross sections may also be considered for such a thermoelectric module. In accordance with this configuration, it is then also possible to identify a central geometric axis and an inner circumferential surface and an outer circumferential surface. In particular, the inner circumferential surface in this case delimits an inner duct, through which the hot medium (exhaust gas) can flow. The thermoelectric elements are positioned in an intermediate space of the thermoelectric module between the inner circumferential surface and the outer circumferential surface. A multiplicity of such thermoelectric elements can be disposed, stacked one upon the other, in the direction of the geometric axis of the thermoelectric module, in particular in such a way that a semiconductor element containing p-doped thermoelectric material and a semiconductor element containing n-doped thermoelectric material are disposed alternately and adjacent one another. To this extent, it is very particularly preferred if the semiconductor element with a predetermined doping extends completely around the inner circumferential surface, e.g. in the manner of disks or rings. This thermoelectric material is then framed by electrically conducting bridges, which are referred to below as connecting elements. The thermoelectric material is then at least partially framed by these connecting elements, and an inner circumferential surface and an outer circumferential surface are thus formed by the connecting elements. The connecting elements preferably surround the thermoelectric material completely both on the inside and the outside. The connecting elements are embodied in the manner of rings or (hollow) cylinders, for example, in accordance with the shape of the semiconductor element.

It is particularly preferred if the thermoelectric material is connected force-lockingly (by pressure) to the connecting elements, in particular without the use of solder, brazing material or an adhesive. A force-locking connection is one which connects two elements together by force external to the elements, as opposed to a form-locking connection which is provided by the shapes of the elements themselves. It is furthermore preferred if the connecting elements simultaneously form a diffusion barrier for the thermoelectric material and an electric conductor. Nickel or molybdenum are preferred as a material for the connecting elements, and it is in each case very particularly preferred if these make up at least 95% by weight of the material of the connecting elements.

The thermoelectric materials or semiconductor elements are then connected to one another electrically in alternation by the connecting elements, and a flow of electric current through the thermoelectric materials and the thermoelectric module arises due to the temperature difference between the inner circumferential surface and the outer circumferential surface. The electrical connection between the thermoelectric materials can also be achieved by a metal bridge, a cable, solder, brazing material or the like. As already explained, the electrical connection is preferably achieved (only) by the connecting element.

The sealing element provided in accordance with the invention then closes off the intermediate space of the thermoelectric module from the outside at each of the ends of the thermoelectric module, thus ensuring that the intermediate space is sealed at least with respect to the cold side but preferably also with respect to the hot side, preventing a cold medium or a hot medium from entering the intermediate space. In this case, the sealing element is preferably a separate component and is not formed by the semiconductor materials, the connecting elements or by an outer or inner tube that surrounds the thermoelectric module. The sealing element thus has an extension in the direction of the axis which is, in particular, at most 20%, preferably at most 10%, of the length of the intermediate space of the thermoelectric module. The length of the intermediate space of the thermoelectric module is defined by the maximum distance between the semiconductor materials in the direction of the axis. In this case, the sealing element has at least one electric conductor, which makes contact with at least one connecting element within the thermoelectric module and can thus conduct an electric current produced in the thermoelectric module through the sealing element to a second or another electric conductor on the outside.

In particular, the sealing element at least partially forms the inner circumferential surface and the outer circumferential surface. This means that the hot and/or cold medium flows directly over the sealing element. If appropriate, the sealing element is separated from the cold side disposed on the outer circumferential surface only by the sleeve, thus allowing a flow of heat between the cold side and the hot side through the sealing element. However, since the sealing element does not have a large extent in the direction of the axis, this flow of heat can only affect the efficiency of the thermoelectric module to a slight extent, even without additional thermal insulation of the sealing element. Sealing of the intermediate space with respect to the cold side and/or the hot side is accomplished, in particular, by a material connection between the sealing element and the connecting elements that generate the outer circumferential surface and/or the inner circumferential surface. The sealing element is preferably connected in an electrically conductive manner to the connecting elements disposed on the inner circumferential surface by the electric conductor, and therefore sealing of the intermediate space with respect to the hot side disposed on the inner circumferential surface of the thermoelectric module is ensured in this case. The sealing at the outer circumferential surface is preferably produced by the formation of a sealing surface between the sleeve and the sealing element. In particular, the sleeve serves for electric insulation of the connecting elements with respect to the cold side. An electric insulating layer of this kind can also be provided on the inner circumferential surface of the thermoelectric module. This electric insulating layer too can be disposed on the inner circumferential surface of the thermoelectric module, in particular after the mounting of the sealing element on the surface. In this case, the sealing element is separated from the cold side or hot side disposed on the inner circumferential surface of the thermoelectric module only by the electric insulating layer.

Since the sealing element at least partially forms the inner circumferential surface and, in particular, in addition, the outer circumferential surface of the thermoelectric module, a simple structural configuration for sealing the intermediate space of the thermoelectric module and, at the same time, for carrying the electric current produced in the thermoelectric module away to the outside has been found. It is preferred if the sealing element according to the invention is provided at both ends of the thermoelectric module, with it being possible to place different embodiments of the sealing element on a thermoelectric module.

In accordance with another particularly preferred feature of the invention, the sealing element is embodied as a single part. This makes it possible, by adding a single part, for the thermoelectric module to be sealed at least with respect to the cold side, on one hand, and to be connected in an electrically conductive manner to a second or another electric conductor disposed outside the thermoelectric module, on the other hand. In this way, a simple configuration is provided which can ensure low-cost assembly and sustained fitness for operation of the thermoelectric module. In this case, "single part" means that, before assembly with the thermoelectric module, the sealing element forms a single structural unit which, in particular, is produced from a plurality of individual components connected force-lockingly, form-lockingly or materially to one another.

In accordance with a further particularly preferred feature of the thermoelectric module of the invention, the sealing element is formed by a plurality of layers and performs at least the following functions:

- formation of an electric conductor for conducting an electric current through the sealing element in a direction of the axis,
- an insulating layer for electric insulation in a radial direction of the thermoelectric module,
- sealing of the intermediate space with respect to a liquid and/or a gaseous medium.

In particular, the sealing element is therefore constructed from at least one ceramic insulating layer and at least one electric conductor layer, which extend one above the other in the radial direction through the sealing element in the direction of the axis and thus produce the sealing element. If appropriate, the ceramic material, which is suitable for electric as well as thermal insulation of the sealing element, where applicable, is framed and correspondingly stabilized by metal supporting elements. A layer of mica can moreover be used instead of the ceramic insulating layer. On at least one side, the electric conductor is preferably embedded in the ceramic material or connected to the mica material, with the sealing element and also the individual layers in each case preferably having an annular or annular segment-shaped construction and being disposed one inside the other. The individual layers are preferably pressed together, giving rise at least to a force-locking but, if possible, also a material connection between the individual layers. The electric conductor of the sealing element preferably protrudes from the sealing element in the direction of the axis and can thus be connected in an electrically conductive manner, in particular materially, e.g. by welding, brazing or soldering, to the connecting elements of the thermoelectric module, thus allowing a flow of current to be passed through the thermoelectric module through the electric conductor to a second electric conductor. Using a mica material makes it possible to achieve a purely force-locking connection between the supporting element(s), the electric conductor and the insulating layer. It is thus possible in this case to dispense with a material connection (by soldering or brazing, for example). Pressing the individual layers together thus makes it possible to achieve a flexible connection between the insulating layer and the electric conductor or the supporting element, allowing thermal expansion in the radial and axial directions to be compensated. Moreover, a force-locking connection of this kind is more suitable for absorbing on a sustained basis the significant forces which are transmitted through the sealing element, due to the fixing of the thermoelectric module on a thermoelectric generator or on a housing by a fastening. The transmission of the retention forces through a ceramic insulating layer might well lead in this case to failure of the sealing element.

Mica is a phyllosilicate in which the standard structure is formed of an octahedral sheet (Os) between two opposite tetrahedral sheets (Ts). These sheets form a layer, which is separated from adjacent layers by areas of unhydrated interlayer cations (I). The sequence is: . . . I Ts Os Ts I Ts Os Ts . . . . The composition of the Ts is $T_2O_5$. The coordinating anions around the octahedrally coordinated cations (M) are formed of oxygen atoms of adjacent Ts and anions A. The coordination of the interlayer cations is nominally 12-fold, with a simplified formula that can be written as follows:

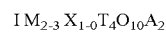

$$I\,M_{2\text{-}3}\,X_{1\text{-}0}T_4O_{10}A_2$$

where:
I=Cs, K, Na, $NH_4$, Rb, Ba, Ca
M=Li, $Fe^{++}$ or $^{+++}$, Mg, $Mn^{++}$ or $^{+++}$, Zn, Al, Cr, V, Ti
T=Be, Al, B, $Fe^{+++}$, Si
A=Cl, F, OH, O (oxy-mica), S.

The following materials are very particularly preferred in this context: micanites (i.e. especially mica fragments compressed and baked with synthetic resin to form large mica films) with high resistance to heat conduction.

In accordance with an added particular feature of the thermoelectric module of the invention, the sealing element has at least one electric insulating layer, and the insulating layer at least partially includes a mica material. In this case, the insulating layer is only force-lockingly connected to the sealing element. In particular, the sealing element has further parts (supporting elements, connecting elements), which are connected to one another materially, force-lockingly and/or form-lockingly. However, the insulating layer is only force-lockingly connected, if appropriate, to the individual parts of the sealing element, e.g. by pressing the parts together. In particular, the insulating layer is formed exclusively by mica.

In accordance with an additional preferred feature of the thermoelectric module of the invention, the outer circumferential surface of the thermoelectric module is formed at least partially by a sleeve, and the intermediate space of the thermoelectric module is sealed off with respect to the hot side and/or the cold side at least by a sealing surface, which is formed by the sleeve and the sealing element. The sleeve extends, in particular, over the connecting elements of the outer circumferential surface and thus forms the outer circumferential surface of the thermoelectric module. This sleeve accordingly surrounds the thermoelectric elements of the thermoelectric module, which are connected at least partially in an electrically conductive manner to one another by connecting elements on their outside. The sleeve proposed herein seals the intermediate space of the thermoelectric module with respect to the hot side or the cold side, whichever is disposed on the outer circumferential surface, and, together with the sealing element, produces a sealing surface, thus ensuring sealing of the intermediate space of the thermoelectric module by the sealing element at the ends of the thermoelectric module. In this case, the sealing element can have, in particular, a sealing surface which runs around in the circumferential direction and, for its part, is surrounded by the sleeve. In particular, an adhesive is disposed between the sleeve and the sealing surface of the sealing element. The adhesive on one hand ensures the fatigue strength of the connection between the sleeve and the sealing element and, at the same time, allows improved sealing. The sealing surface can furthermore also have an O-ring (in addition to or instead of the adhesive), which is disposed, in particular, in the sealing element, e.g. in a groove, or, alternatively, in the sleeve itself, with the O-ring surrounding the sealing element in the circumferential direction. In the case where the O-ring is disposed in a groove in the sealing element, the sleeve is preferably additionally surrounded by a further fixing element, which presses the sleeve against the O-ring or against the sealing surface, ensuring permanent sealing of the intermediate space. In particular, this embodiment can also be implemented at the inner circumferential surface of the thermoelectric module. In this case, the inner circumferential surface of the thermoelectric module is at least partially formed by a sleeve and the intermediate space is sealed at least by a sealing surface formed by the sleeve and the sealing element. Accordingly, the sleeve extends over the connecting elements of the inner circumferential surface and thus forms the inner circumferential surface of the thermoelectric module. Consequently, this sleeve surrounds the thermoelectric elements of the thermoelectric module, which are connected to one another at least partially in an electrically conductive manner by connecting elements on their inside. The sleeve proposed herein seals the intermediate space of the thermoelectric module with respect to the hot side or cold side, whichever is disposed on the inner circumferential surface, and, together with the sealing element, produces a sealing surface, thus ensuring sealing of the intermediate space at the ends of the thermoelectric module. The other statements made above in relation to the configuration of an adhesive and/or of an O-ring apply accordingly.

With the objects of the invention in view, there is concomitantly provided a vehicle, comprising an internal combustion engine, an exhaust system and a cooling system. The vehicle includes a thermoelectric generator which has at least one thermoelectric module according to the invention. The exhaust system extends through the inner circumferential surface of the thermoelectric module, and the cooling system extends along the outside of the outer circumferential surface of the thermoelectric module. In other words, this also means that, for example, the cold medium of the coolant system is passed along the outside of the outer circumferential surface of the thermoelectric module, and therefore the outer circumferential surface of the thermoelectric module represents the cold side. This also means that the hot exhaust gas flows internally through a duct delimited by the inner circumferential surface of the thermoelectric module, and therefore the inner circumferential surface then represents the hot side. It is particularly preferred in this case if the thermoelectric generator is constructed in the manner of a tube bundle, in which case, on one hand, a multiplicity of the thermoelectric modules is then connected to the exhaust system and there is therefore a flow of hot exhaust gas through the modules and, on the other hand, the thermoelectric modules are disposed in a common (spaced) housing, for example, thus allowing a coolant flow to flow jointly around them. Of course, corresponding electric terminals and leads have to be provided in order to implement reliable power generation and transmission of the power, of the coolant and of the exhaust gas. In particular, it is also possible for the cold medium of the coolant system to flow through the inside of the duct delimited by the inner circumferential surface of the thermoelectric module. In this case, the outer circumferential surface forms the hot side and the inner circumferential surface forms the cold side.

Other features which are considered as characteristic for the invention are set forth in the appended claims, noting that the features presented individually in the claims can be combined in any technologically meaningful way and give rise to additional embodiments of the invention.

Although the invention is illustrated and described herein as embodied in a thermoelectric module for a thermoelectric generator of a vehicle with a sealing element and a vehicle having the thermoelectric module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
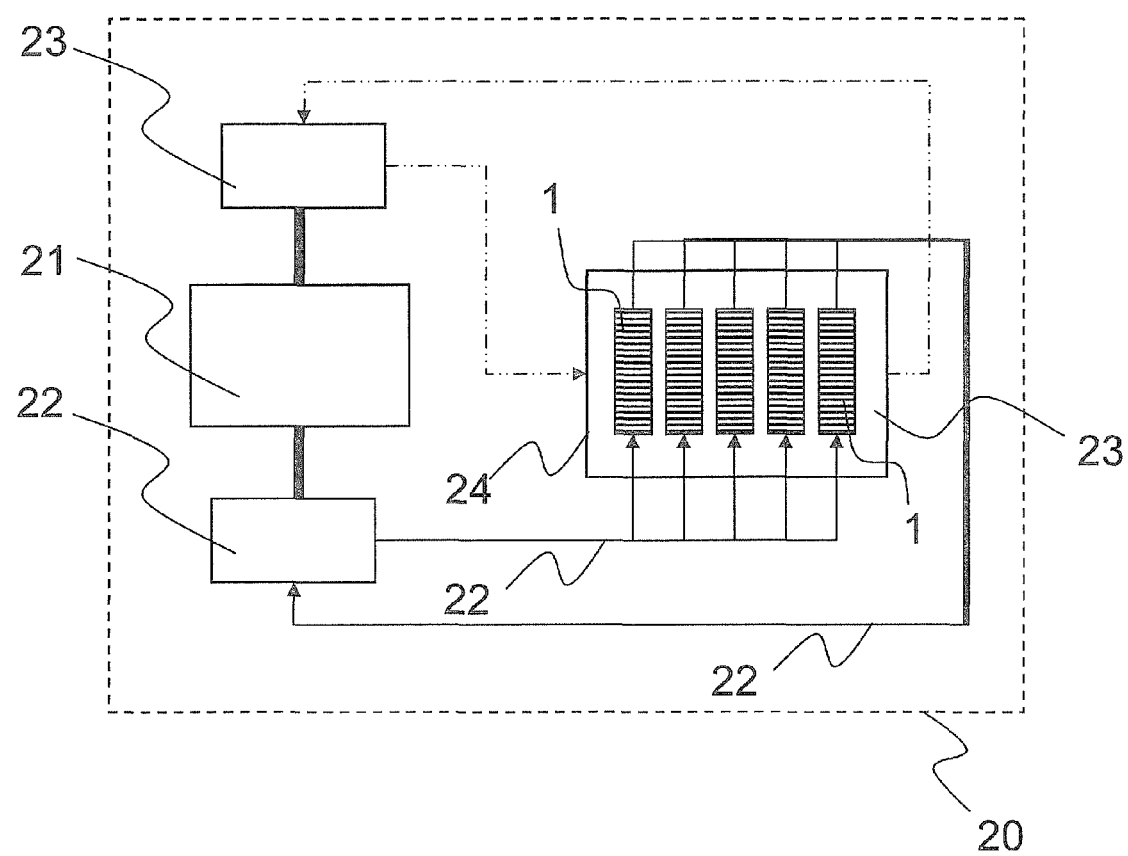
FIG. 1 is a block diagram of a vehicle having a thermoelectric generator and a plurality of thermoelectric modules.

Referring now to the figures of the drawings in detail and first, particularly, to FIG. 1 thereof, there is seen a vehicle 20 having an internal combustion engine 21, an exhaust system 22, a cooling system 23 and a thermoelectric generator 24 having a plurality of thermoelectric modules 1. The thermoelectric modules 1 are connected to the exhaust system 22 and therefore an exhaust gas flows through the thermoelectric modules 1. The cooling system 23 is connected to the thermoelectric generator 24 in such a way that there is a flow of a cold medium over the outside of the thermoelectric modules 1.

Figure 2:
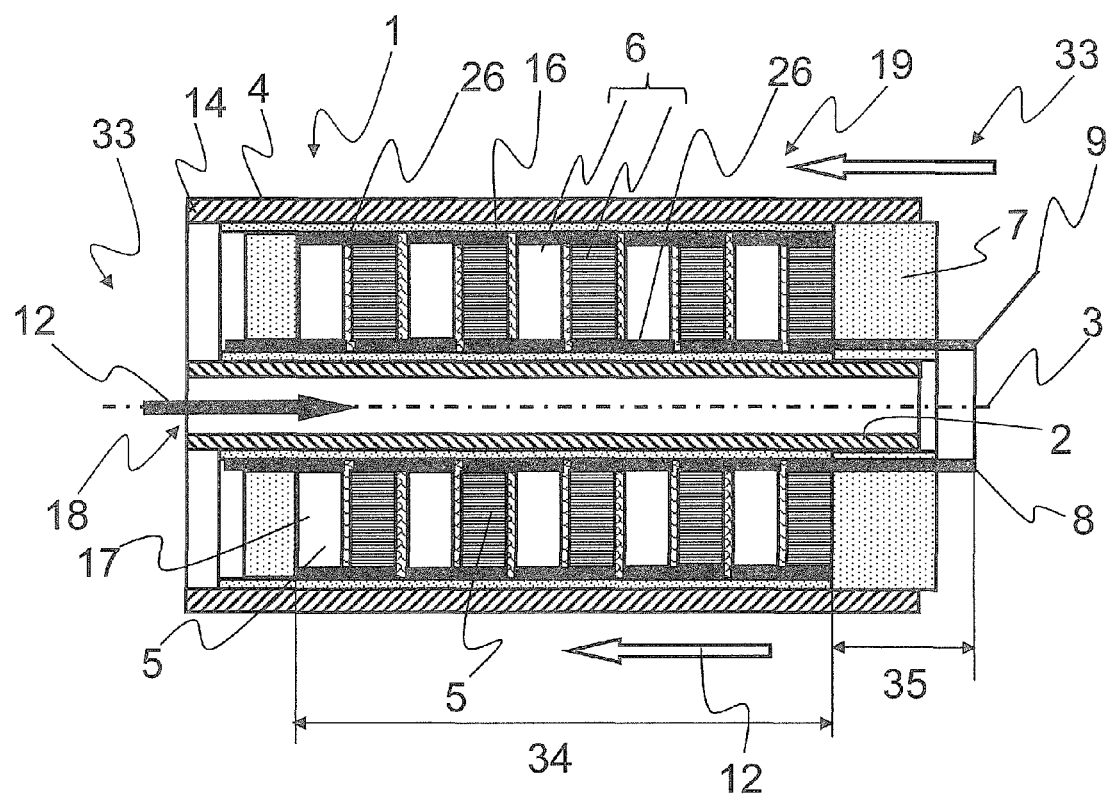
FIG. 2 is a diagrammatic, longitudinal-sectional view of a tubular thermoelectric module.

FIG. 2 shows a tubular thermoelectric module 1 having an inner circumferential surface 2, an outer circumferential surface 4 and thermoelectric elements 6, which are formed by n-doped and p-doped semiconductor elements 5. The semiconductor elements 5 are connected to one another electrically in alternation at the inner circumferential surface 2 and at the outer circumferential surface 4 by connecting elements 26. These thermoelectric elements 6 are disposed in an intermediate space 17, which extends between the inner circumferential surface 2 and the outer circumferential surface 4 along an axis 3 of the thermoelectric module 1. A (hot) medium 12 (exhaust gas) flows along the inner circumferential surface 2, and a (cold) medium 12 (cooling water) flows over the outer circumference 4. As a result, a "cold side" 19 is formed on the outer circumferential surface 4 and a "hot side" 18 is formed on the inner circumferential surface 2. An insulating layer 16 is furthermore disposed between the outer circumferential surface 4 and the thermoelectric elements 6 and connecting elements 26, as a result of which the medium 12 on the cold side 19 is electrically insulated from the connecting elements 26. The thermoelectric module 1 has ends 33 that are disposed along the axis 3 and a respective sealing element 7 at each end 33. The sealing element 7 is disposed within a sleeve 14 and at least partially forms the outer circumferential surface 4 and the inner circumferential surface 2. The sealing element 7 has an electric conductor 8 which connects the connecting elements 26 in an electrically conductive manner to a second electric conductor 9 disposed outside the thermoelectric module 1. A plurality of thermoelectric modules 1 can be connected in series or in parallel through this second electric conductor 9, thus making it possible to construct a thermoelectric generator from a multiplicity of thermoelectric modules 1. The intermediate space 17 of the thermoelectric module 1 has a length in the direction of the axis 3 which is defined by a distance 34 between the outermost semiconductor elements 5. The sealing element 7 has an extent 35 in the direction of the axis 3.

Figure 3:
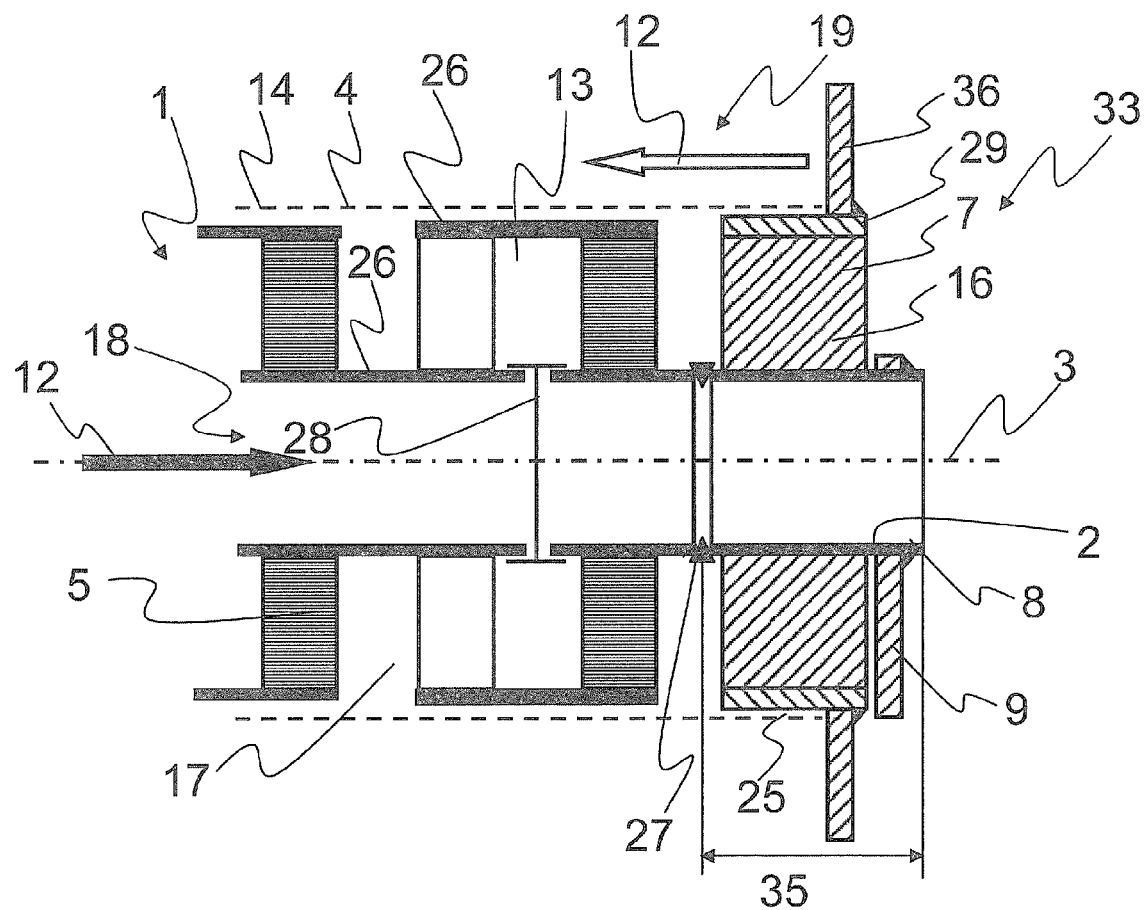
FIG. 3 is a longitudinal-sectional view of one end of a thermoelectric module having a first sealing element.

FIG. 3 shows one end 33 of a thermoelectric module 1 having a sealing element 7. The inner circumferential surface 2 of the thermoelectric module 1 is formed at least partially by connecting elements 26 and by the electric conductor 8 of the sealing element 7, and the outer circumferential surface 4 is formed at least partially by a sleeve 14. The semiconductor elements 5 are each n-doped or p-doped and are connected electrically to one another in alternation by connecting elements 26. In this case, the connecting elements 26 do not form a continuous inner circumferential surface 2 and outer circumferential surface 4, and therefore seals 28 are additionally provided, at least on the inner circumferential surface 2, preventing the ingress of a medium 12 from the hot side 18 into the intermediate space 17 of the thermoelectric module 1 and into a gap 13 between the semiconductor elements 5.

The seals 28 are preferably embodied in such a way that they project beyond the inner circumferential surface 2, formed by the connecting elements 26, into a duct surrounded by the inner circumferential surface 2. The seals 28 can thus form turbulence generators, which bring about additional turbulence of the medium 12 and thus improve heat transfer between the medium 12 and the thermoelectric module 1.

The sealing element 7 seals the thermoelectric module 1 with respect to the outside at the end 33, thus preventing a medium 12 from entering the intermediate space 17 of the thermoelectric module 1, at least from the cold side 19. For this purpose, a sealing surface 25 is formed between the sleeve 14 and the sealing element 7. The sealing surface 25 is formed in this case by a supporting element 29, which surrounds an electric and, if appropriate, thermal insulating layer 16. This supporting element 29 serves to stabilize the insulating layer 16, which is preferably ceramic. For its part, the insulating layer 16 surrounds the electric conductor 8 of the sealing element 7, which is connected to the electrically conducting connecting elements 26 of the thermoelectric module 1 by a joint 27 which, as shown therein, is accessible through the outer circumferential surface 4 for a joining process.

Provision is made in this case for the sealing element 7 to at least partially form the outer circumferential surface 4 and the inner circumferential surface 2 of the thermoelectric module 1. This also includes a situation where only a fastening 36 belonging to the sealing element 7 makes direct contact with the medium 12. The thermoelectric module 1, if appropriate together with further thermoelectric modules 1, is fixed in a housing by the fastening 36, thus forming a thermoelectric generator. In this case, the extent 35 of the sealing element 7 in the direction of the axis 3 is defined by the electric conductor 8, which projects at both ends of the sealing element 7. The electric conductor 8 makes contact with a second electric conductor 9, through which the thermoelectric module 1 can be connected, electrically in parallel or in series, to other thermoelectric modules 1.

Figure 4:
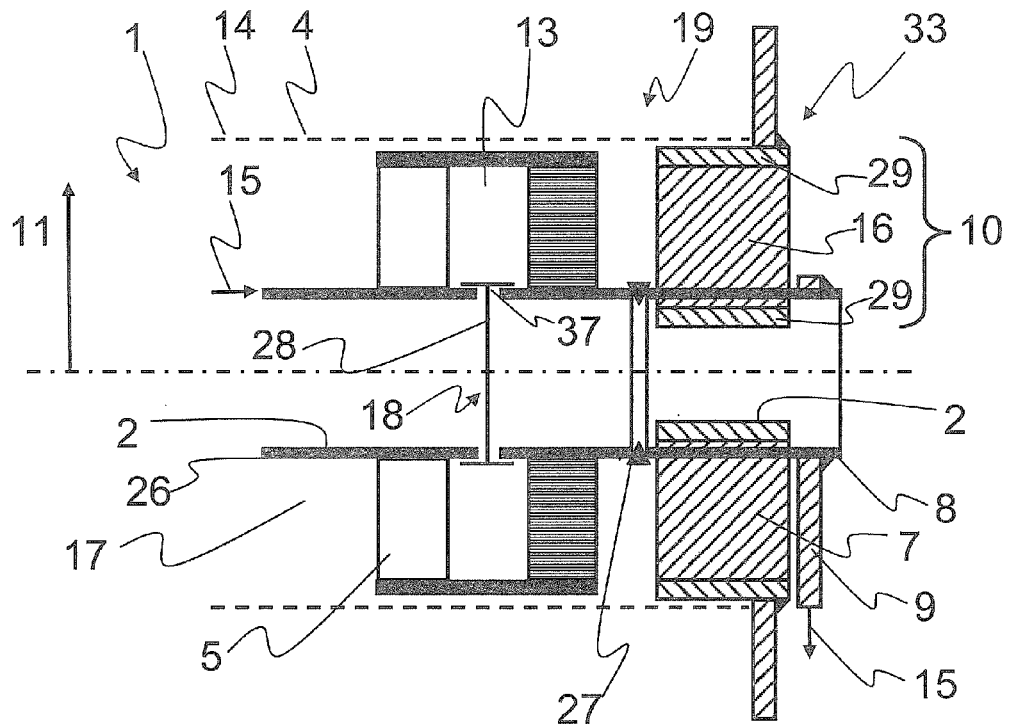
FIG. 4 is a longitudinal-sectional view of one end of a thermoelectric module having a second sealing element.

FIG. 4 shows one end 33 of a thermoelectric module 1 having a further sealing element 7. In this case too, the intermediate space 17 of the thermoelectric module 1 is surrounded by an inner circumferential surface 2 and an outer circumferential surface 4, with the outer circumferential surface 4 being formed at least partially by a sleeve 14. A gap 13 is furthermore formed between the semiconductor elements 5 and, as shown therein, has an opening 37 through the inner circumferential surface 2 toward the hot side 18. However, this opening 37 to the hot side 18 is sealed by a seal 28, thus ensuring that the semiconductor elements 5 and connecting elements 26 are thermally and electrically insulated by the gap 13, which is filled, in particular, with air or a suitable insulating material. The further sealing element 7 is connected to the connecting element 26 through a joint 27 in such a way that an electric current 15 generated in the thermoelectric module 1 flows from the connecting element 26, through the joint 27, toward the electric conductor 8 and can be connected, through a collecting configuration in the form of a second electric conductor 9, which is disposed on the electric conductor 8, to further electric conductors 8. The sealing element 7 is constructed in the radial direction 11 from a plurality of layers 10 and, on its inner and outer circumferential surfaces, has supporting elements 29, which are, in particular, of metal construction and hold an annular insulating material disposed therebetween as an insulating layer 16. This insulating layer 16 serves to provide electric insulation of the electric conductor 8 from the cold side 19.

Figure 5:
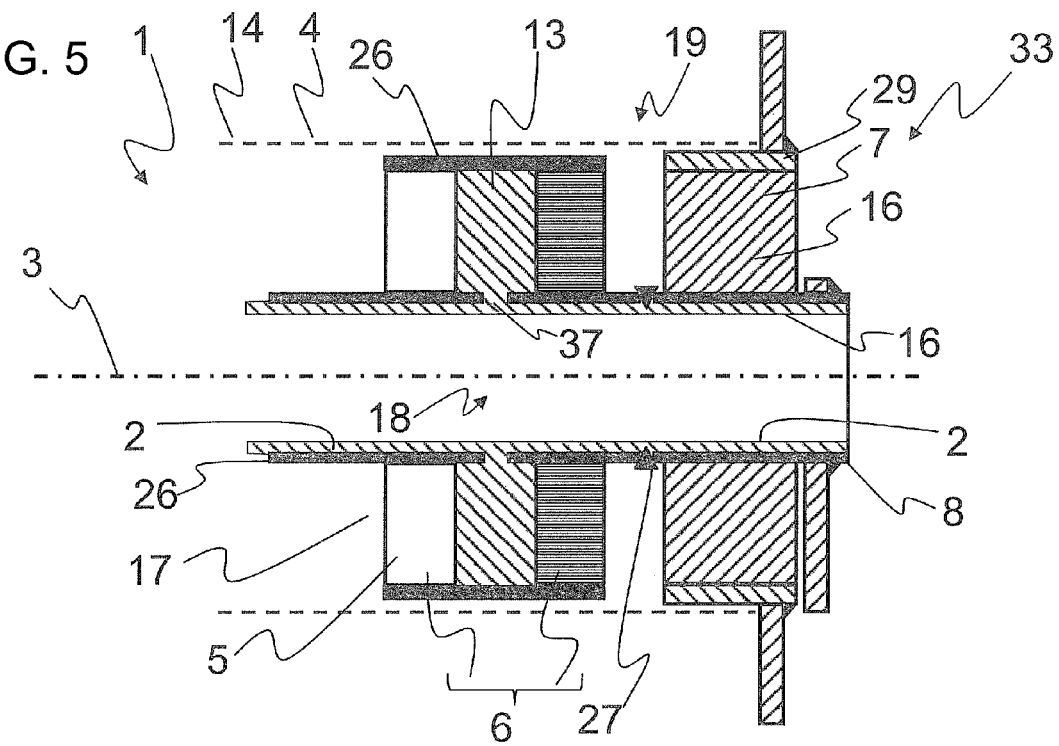
FIG. 5 is a longitudinal-sectional view of one end of a thermoelectric module having a third sealing element.

FIG. 5 shows a third variant embodiment of the sealing element 7 at one end 33 of a thermoelectric module 1. The thermoelectric module 1 has semiconductor elements 5, which are disposed in the intermediate space 17 along the axis 3 and form thermoelectric elements 6. A gap 13, which is disposed between the semiconductor elements 5, is connected to the hot side 18 disposed on the inner circumferential surface 2. The semiconductor elements 5 are connected to one another electrically in alternation by connecting elements 26, enabling an electric current to be generated by the thermoelectric module 1 when a cold side 19 and a hot side 18 are provided. At the end 33, the thermoelectric module 1 is sealed by a sealing element 7, wherein an outer annular supporting element 29 surrounds an insulating layer 16 which, for its part, surrounds the electric conductor 8. The electric conductor 8 is connected in an electrically conductive manner to the connecting elements 26 by a joint 27. After the installation of the sealing element 7, a further insulating layer 16 is applied to the inner circumferential surface 2. That insulating layer also extends through the opening 37 in the inner circumferential surface 2 into the respective gaps 13 between the semiconductor elements 5 and at least partially fills these cavities. This particularly preferred variant embodiment of a thermoelectric module 1 allows particularly simple production of the thermoelectric module 1, in which, after the installation of the sealing element 7, a sleeve 14 is disposed on the outer circumferential surface 4 and thus forms the outer circumferential surface 4 of the thermoelectric module 1. The insulating layer 16, which is added in this case after the installation of the sealing element 7, can subsequently be removed again in the area of the inner circumferential surface 2, with the result that only the gaps 13 and the openings 37 are filled with the insulating material but the inner circumferential surface 2 is formed at least partially by the connecting elements 26 and by the electric conductor 8.

Figure 6:
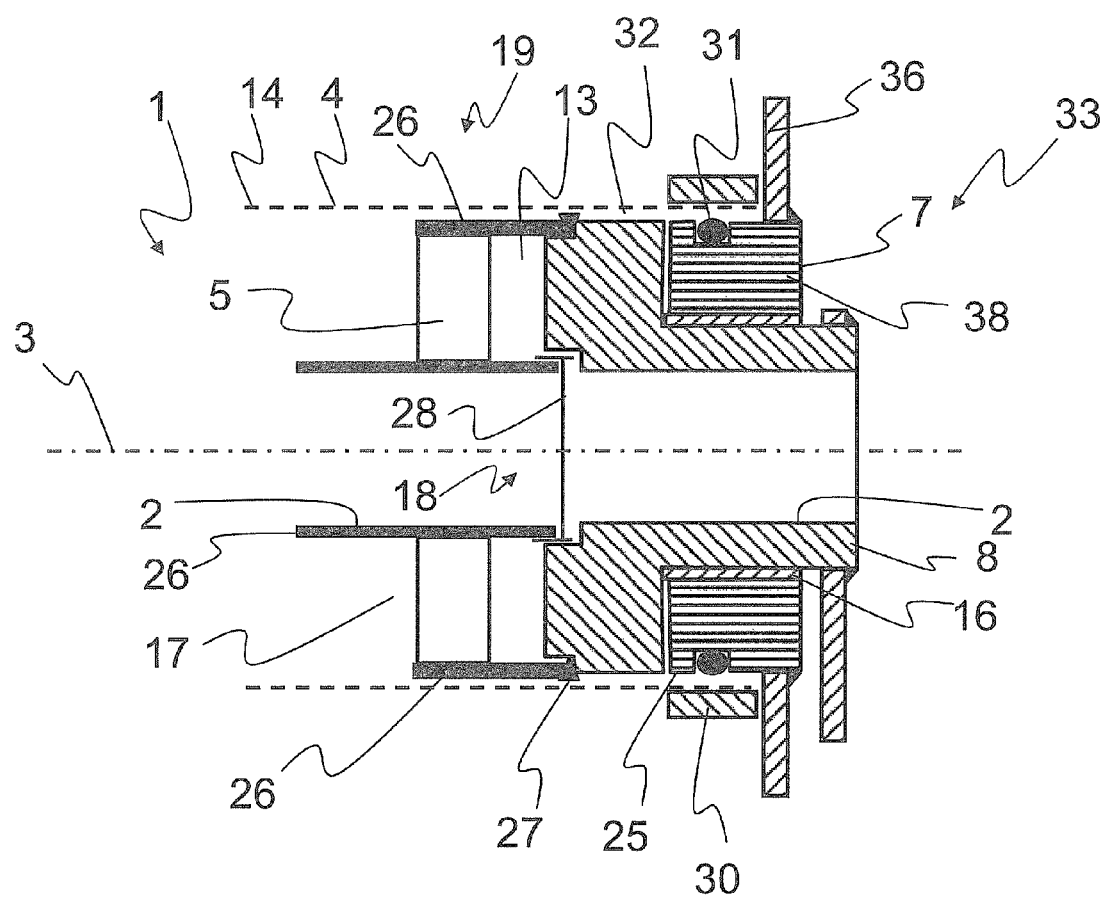
FIG. 6 is a longitudinal-sectional view of one end of a thermoelectric module having a fourth sealing element.

FIG. 6 shows a fourth variant embodiment of a sealing element 7, which is disposed at one end 33 of the thermoelectric module 1. In this case, a multi-part sealing element 7 is provided, which is connected in an electrically conductive manner to a connecting element 26 disposed on the outer circumferential surface 4. In this case, the electric conductor 8 is constructed as a sleeve which, for its part, carries a further element 38 of the sealing element 7, which is electrically insulated from the electric conductor 8 by an insulating layer 16. In this case, a sleeve 14 is disposed on the outer circumferential surface 4, forming a sealing surface 25 on the sealing element 7 together with an O-ring 31 and a fixing element 30. Moreover, an adhesive 32 is provided, which additionally assists in sealing the intermediate space 17 from the cold side 19. The electric conductor 8 is connected in an electrically conductive manner to the connecting element 26 by a joint 27, in this case a welded joint. The inner circumferential surface 2 is formed at least partially by connecting elements 26 and by the electric conductor 8 of the sealing element 7. In this case, the electrically insulating gap 13 that may be present between the semiconductor elements 5 or between semiconductor elements 5 and the sealing element 7 is separated in a gastight manner from the hot side 18 by a seal 28.

The sealing element 7 has the following further function, namely that of connecting the thermoelectric module 1 to a thermoelectric generator 24 through the sealing element 7, with the sealing element 7 ensuring the mechanical fixing of the thermoelectric module 1 within the thermoelectric generator by the fastening 36. In order to improve force transmission from the fastening 36, through the further element 38, to the electric conductor 8, a mica material is preferred as an insulating layer 16. The insulating layer 16, the electric conductor 8 and the further element 38 are pressed together mechanically, thereby producing a purely force-locking connection between the parts. Thus, a connection is produced which can compensate thermal and mechanical stresses and differences in the expansion of the parts without failing. Moreover, an electric insulation can be disposed between the electric conductor 8 and the further element 38, ensuring that the electric conductor 8 and the further element 38 do not come into contact through a relative movement in the direction of the axis 3, due to the flexible connection between the parts. Instead of this additional electric insulation, it is also possible to provide a mechanical stop which prevents such contact.

The sealing element 7 ensures sealing of the intermediate space 17 of the thermoelectric module 1 in a manner which is very simple in terms of construction since the sealing element 7 extends from the inner circumferential surface 2 as far as the outer circumferential surface 4 and, if appropriate, is separated from the cold side 19 disposed there only by the sleeve 14. By virtue of the fact that the sleeve 14 is installed only after fixing the sealing element 7, it is possible to dispense with complex tolerance analysis since the sealing element 7 adjoins the individual components of the thermoelectric module 1 in the direction of the axis 3 and does not have to be pushed into a rigid sleeve 14, in which case corresponding fits would have to be ensured for sealing. On the contrary, a butt joint is formed between the electric conductor 8 of the sealing element 7 and the connecting elements 26 at joints 27, with the sealing of the intermediate space 17 being accomplished at one end by the joints 27 and, at the other end, in particular on the outer circumferential surface 4, by the sleeve 14 in conjunction with the sealing element 7.

The invention claimed is:

1. A thermoelectric module, comprising:
    a geometric axis;
    a hot side to be contacted by a hot medium and a cold side to be contacted by a medium;
    at least one thermoelectric element;
    an inner circumferential surface and an outer circumferential surface each being assigned to a respective one of said hot side or said cold side, said inner circumferential surface and said outer circumferential surface forming an intermediate space therebetween; and
    at least one sealing element at least partially forming said inner circumferential surface or being separated from said hot side or said cold side disposed at said inner circumferential surface only by an electric insulating layer;
    said inner cirumferential surface, formed by said at least one sealing element or by said electric insulating layer, configured to be directly contacted by the hot or cold medium;
    said at least one sealing element sealing said intermediate space at least with respect to said cold side; and
    said at least one sealing element having at least one electric conductor configured to connect said at least one thermoelectric element disposed in the thermoelectric module to at least one other electric conductor disposed outside the thermoelectric module.

2. The thermoelectric module according to claim 1, wherein said at least one sealing element is a single part.

3. The thermoelectric module according to claim 1, wherein said at least one sealing element is formed of a plurality of layers and is configured to perform at least the following functions:
    formation of said electric conductor for conducting an electric current through said at least one sealing element in a direction of said geometric axis;
    formation of said insulating layer for electric insulation in a radial direction of the thermoelectric module; or
    sealing of said intermediate space with respect to a liquid and/or a gaseous medium.

4. The thermoelectric module according to claim 1, wherein said electric insulating layer at least partially includes a mica material and is only force-lockingly connected to said at least one sealing element.

5. The thermoelectric module according to claim 1, which further comprises:
   a sleeve at least partially forming said outer circumferential surface; and
   a sealing surface formed by said sleeve and said at least one sealing element, said sealing surface sealing off said intermediate space with respect to at least one of said hot side or said cold side.

6. A vehicle, comprising:
   an internal combustion engine;
   a thermoelectric generator having at least one thermoelectric module according to claim 1;
   an exhaust system receiving exhaust gases from said internal combustion engine and extending through said inner circumferential surface of said at least one thermoelectric module; and
   a cooling system extending along an outside of said outer circumferential surface of said at least one thermoelectric module.

* * * * *